US012700855B2

(12) United States Patent
Elmallah et al.

(10) Patent No.: US 12,700,855 B2
(45) Date of Patent: Aug. 4, 2026

(54) ENHANCEMENT OF LINEARITY FOR DIGITALLY CONTROLLED DELAY LINE

(71) Applicant: MediaTek Inc., Hsin-Chu (TW)

(72) Inventors: Ahmed Safwat Mohamed Aboelenein Elmallah, San Jose, CA (US); Amr Tarek Ahmed Abdelrazik Khashaba, San Jose, CA (US); Mohammed Mohsen Abdulsalam Abdullatif, San Jose, CA (US); Tamer Mohammed Ali, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 140 days.

(21) Appl. No.: 18/496,495

(22) Filed: Oct. 27, 2023

(65) Prior Publication Data

US 2024/0171167 A1     May 23, 2024

Related U.S. Application Data

(60) Provisional application No. 63/384,620, filed on Nov. 22, 2022.

(51) Int. Cl.
  *H03K 5/14*          (2014.01)
  *H03K 5/135*        (2006.01)
(52) U.S. Cl.
  CPC ............... *H03K 5/14* (2013.01); *H03K 5/135* (2013.01)

(58) Field of Classification Search
  CPC . H03L 7/0814; H03L 7/08; H03L 7/06; H03L 7/00; H03L 7/0816; H03L 7/087; H03L 7/085; H03L 7/093; H03L 7/089; H03L 2207/50
  See application file for complete search history.

(56) References Cited

U.S. PATENT DOCUMENTS 12,143,113 B2 *  11/2024  Park ...................... H03L 7/0998
12,212,327 B2 *   1/2025  Lu ........................... H03L 7/099

* cited by examiner

*Primary Examiner* — Diana J. Cheng
(74) *Attorney, Agent, or Firm* — Winston Hsu

(57)          ABSTRACT

A digitally controlled delay device includes a plurality of first delay stages connected in series between a first input port and a first output port, and a plurality of second delay stages connected in series between a second input port and a second output port. Each first delay stage of the plurality of first delay stages includes a plurality of first delay elements and each second delay stage of the plurality of second delay stages includes a corresponding plurality of second delay elements. A controller performs complementary control based on a digital control signal by controlling one or more of the plurality of first delay elements to be in a first control state and controlling a corresponding one or more of the plurality of second delay elements to be in a second control state, opposite the first control state.

18 Claims, 6 Drawing Sheets

| code 105 | REF120-1 | REF120-2 | REF120-3 | REF120-4 | FB120-1 | FB120-2 | FB120-3 | FB120-4 |
|---|---|---|---|---|---|---|---|---|
| 1 | : | : | C0 | : | : | : | : | : |
| 2 | : | : | : | : | C1:C0 | : | : | : |
| 4 | : | : | C3:C2 | : | C3:C2 | : | : | : |
| 8 | : | : | C7:C4 | : | C7:C4 | : | : | : |
| 16 | : | : | C15:C8 | : | C15:C8 | : | : | : |
| 32 | : | : | C31:C16 | : | C31:C16 | : | : | : |
| 64 | : | : | C63:C32 | : | C63:C32 | : | : | : |
| 128 | : | : | C127:C64 | : | C127:C64 | : | : | : |
| 256 | C127:C0 | : | | : | | : | C127:C0 | : |
| 512 | : | C127:C0 | | C127:C0 | | C127:C0 | : | C127:C0 | turned off (REF120-1 – REF120-4)    turned on (FB120-1 – FB120-4)

610

620 630 640 650 660 670 680 690

710

| code 105 | REF120-1 | REF120-2 | REF120-3 | REF120-4 | FB120-1 | FB120-2 | FB120-3 | FB120-4 |
|---|---|---|---|---|---|---|---|---|
| 1 | - | - | C0 | - | - | - | - | - |
| 2 | - | - | - | - | C0 | C0 | - | - |
| 4 | C0 | C0 | - | - | - | - | C0 | C0 |
| 8 | C1 | C1 | C1 | C1 | C1 | C1 | C1 | C1 |
| 16 | C3:C2 | C3:C2 | C3:C2 | C3:C2 | C3:C2 | C3:C2 | C3:C2 | C3:C2 |
| 32 | C7:C4 | C7:C4 | C7:C4 | C7:C4 | C7:C4 | C7:C4 | C7:C4 | C7:C4 |
| 64 | C15:C8 | C15:C8 | C15:C8 | C15:C8 | C15:C8 | C15:C8 | C15:C8 | C15:C8 |
| 128 | C31:C16 | C31:C16 | C31:C16 | C31:C16 | C31:C16 | C31:C16 | C31:C16 | C31:C16 |
| 256 | C63:C32 | C63:C32 | C63:C32 | C63:C32 | C63:C32 | C63:C32 | C63:C32 | C63:C32 |
| 512 | C127:C64 | C127:C64 | C127:C64 | C127:C64 | C127:C64 | C127:C64 | C127:C64 | C127:C64 | turned off (REF120-1 ... REF120-4)     turned on (FB120-1 ... FB120-4)

| code 105 | REF120-1 | REF120-2 | REF120-3 | REF120-4 | FB120-1 | FB120-2 | FB120-3 | FB120-4 |
|---|---|---|---|---|---|---|---|---|
| 1 | - | - | C0 | - | - | C0 | - | - |
| 2 | - | C0 | - | - | - | - | C0 | - |
| 4 | C0 | - | - | - | - | - | - | C0 |
| 8 | C1 | C1 | C1 | C1 | C1 | C1 | C1 | C1 |
| 16 | C3:C2 | C3:C2 | C3:C2 | C3:C2 | C3:C2 | C3:C2 | C3:C2 | C3:C2 |
| 32 | C7:C4 | C7:C4 | C7:C4 | C7:C4 | C7:C4 | C7:C4 | C7:C4 | C7:C4 |
| 64 | C15:C8 | C15:C8 | C15:C8 | C15:C8 | C15:C8 | C15:C8 | C15:C8 | C15:C8 |
| 128 | C31:C16 | C31:C16 | C31:C16 | C31:C16 | C31:C16 | C31:C16 | C31:C16 | C31:C16 |
| 192 | C47:C16 | C47:C16 | C47:C16 | C47:C16 | C47:C16 | C47:C16 | C47:C16 | C47:C16 |
| 256 | C63:C16 | C63:C16 | C63:C16 | C63:C16 | C63:C16 | C63:C16 | C63:C16 | C63:C16 |
| 320 | C79:C16 | C79:C16 | C79:C16 | C79:C16 | C79:C16 | C79:C16 | C79:C16 | C79:C16 |
| 384 | C95:C16 | C95:C16 | C95:C16 | C95:C16 | C95:C16 | C95:C16 | C95:C16 | C95:C16 |
| 448 | C111:C16 | C111:C16 | C111:C16 | C111:C16 | C111:C16 | C111:C16 | C111:C16 | C111:C16 |
| 512 | C127:C16 | C127:C16 | C127:C16 | C127:C16 | C127:C16 | C127:C16 | C127:C16 | C127:C16 |

(REF120-1 … REF120-4 group: turned off; FB120-1 … FB120-4 group: turned on)

FIG. 8

ENHANCEMENT OF LINEARITY FOR DIGITALLY CONTROLLED DELAY LINE

CROSS-REFERENCE TO RELATED APPLICATIONS

This application claims benefit of priority under 35 U.S.C. § 119(e) to U.S. Provisional Application No. 63/384,620, filed Nov. 22, 2022, the entirety of which is hereby incorporated herein by reference.

BACKGROUND

This invention relates to digitally controlled delay lines (DCDLs) and, more particularly, to enhancement of linearity for a DCDL.

Generally, in electronics and, more particularly, in digital electronics, a clock signal is a voltage or current-based electronic logic signal that oscillates between a low state and a high state at a constant frequency. This clock signal is used to synchronize actions in various digital circuits. Sometimes, delays are introduced in the clock signal to correct and compensate for variations in signal propagation times between different signal paths. Delaying the clock signal may facilitate improved synchronization of the various signals in a circuit by allowing each signal to settle before being used. DCDLs, whose delay is controllable, are found in various applications. For example, a DCDL may be used in a retimer that acts as a repeater for a high-speed serial link. A DCDL may also be used in a radio frequency (RF) transmitter or receiver as part of a frequency synthesizer or, more specifically, a phase-locked loop (PLL)-based frequency synthesizer.

SUMMARY

According to one or more embodiments, a digitally controlled delay device includes a plurality of first delay stages connected in series between a first input port and a first output port, and a plurality of second delay stages connected in series between a second input port and a second output port. Each first delay stage of the plurality of first delay stages includes a plurality of first delay elements and each second delay stage of the plurality of second delay stages includes a corresponding plurality of second delay elements. A controller performs complementary control of the plurality of first delay elements in one of the plurality of first delay stages and the plurality of second delay elements in one of the plurality of second delay stages based on a digital control signal. The complementary control refers to controlling one or more of the plurality of first delay elements specified by the digital control signal to be in a first control state and controlling a corresponding one or more of the plurality of second delay elements to be in a second control state, opposite the first control state.

According to another embodiment, a digitally controlled delay device includes a plurality of first delay stages connected in series between a first input port and a first output port, and a plurality of second delay stages connected in series between a second input port and a second output port. Each first delay stage of the plurality of first delay stages includes a plurality of first delay elements and each second delay stage of the plurality of second delay stages includes a corresponding plurality of second delay elements. A controller performs complementary control of the plurality of first delay elements in each of the plurality of first delay stages and the plurality of second delay elements in each of the plurality of second delay stages based on a digital control signal. The complementary control refers to controlling one or more of the plurality of first delay elements specified by the digital control signal to be in a first control state and controlling a corresponding one or more of the plurality of second delay elements to be in a second control state, opposite the first control state.

According to another embodiment, a digitally controlled delay device includes a plurality of first delay stages connected in series between a first input port and a first output port, and a plurality of second delay stages connected in series between a second input port and a second output port. Each first delay stage of the plurality of first delay stages includes a plurality of first delay elements and each second delay stage of the plurality of second delay stages includes a corresponding plurality of second delay elements. A controller controls, based on a code indicated by a digital control signal, the plurality of first delay elements in the plurality of first delay stages and the plurality of second delay elements in the plurality of second delay stages. Based on a first code, the controller controls a first set of the plurality of first delay elements of one of the plurality of first delay stages or the plurality of second delay elements of one of the plurality of second delay stages to be in a first state, the first code specifying a number of the first set. Based on a second code, greater than the first code, the controller maintains the first set of the plurality of first delay elements of one of the plurality of first delay stages or the plurality of second delay elements of one of the plurality of second delay stages in the first state and controls additional ones of the plurality of first delay elements of one of the plurality of first delay stages or the plurality of second delay elements of one of the plurality of second delay stages to be in a first state, a number of the additional ones being a difference between a number specified by the second code and the number of the first set.

The foregoing has outlined some of the pertinent features of the disclosed subject matter. These features are merely illustrative.

BRIEF DESCRIPTION OF THE DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

FIG. 7 illustrates a control scheme for cross-stage aggregation of delay elements according to one embodiment; and FIG. 8 illustrates a control scheme using segmentation of the delay elements associated with higher values of the code according to one embodiment.

DETAILED DESCRIPTION

Figure 1:
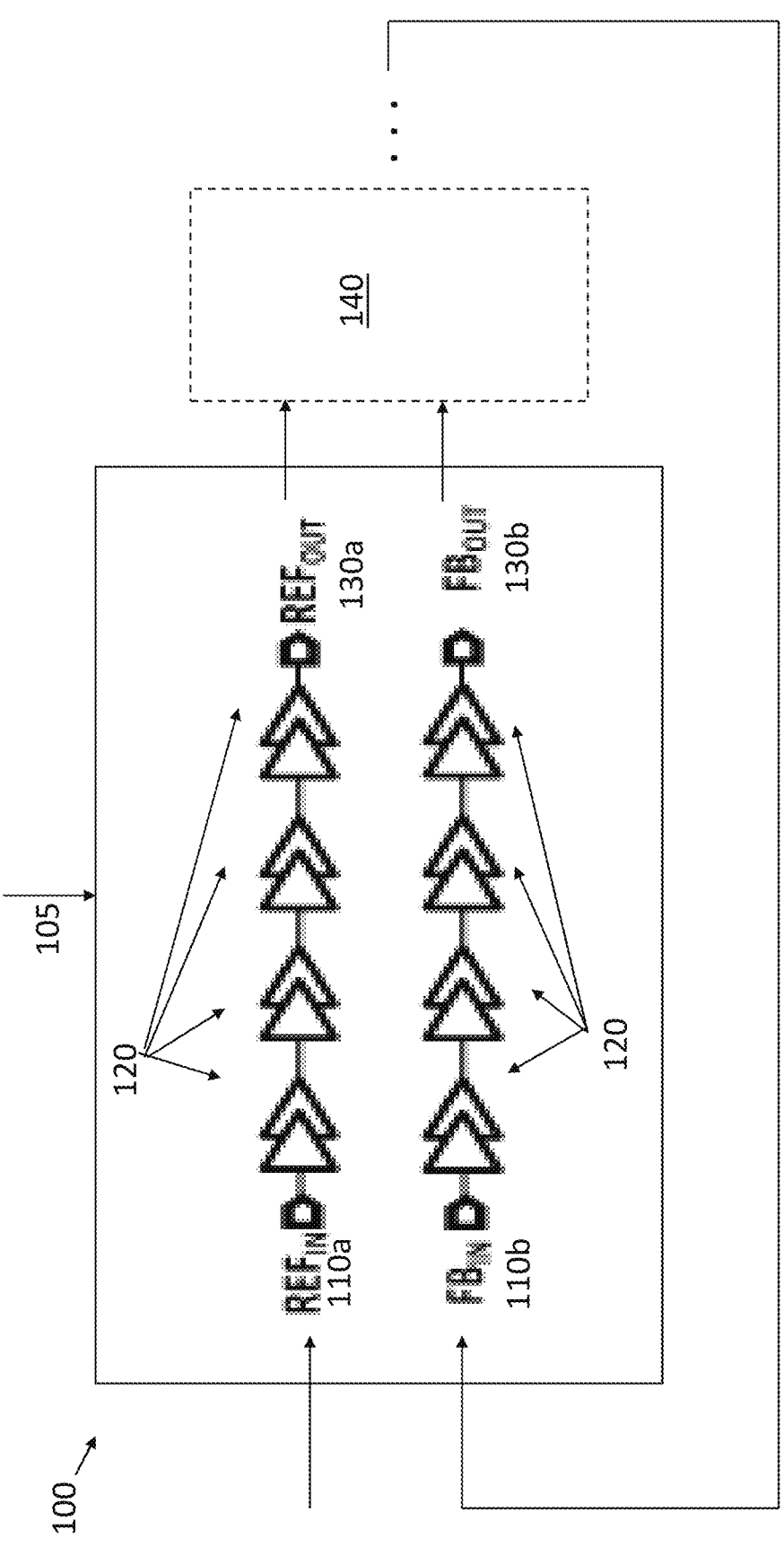
FIG. 1 is a block diagram of aspects of a digitally controlled delay line (DCDL) according to one or more embodiments.

Reference will now be made to the drawings to describe the present disclosure in detail. It will be understood that the drawings and exemplified embodiments are not limited to the details thereof. Modifications may be made without departing from the spirit and scope of the disclosed subject matter.

Using DCDLs can have benefits like lower power usage, smaller area, improved linearity and resolution as compared with other devices, such as phase rotators, that have been used in applications such as digital phase-locked loop (PLL)-based frequency synthesizer. However, DCDLs can be a source of fractional spurious signals, referred to as fractional spurs, that can be challenging to filter out without affecting the desired output. One reason for the fractional spurs is non-linearity of the DCDLs. This non-linearity may be due, in large part, to a dependence of the delay of an inverter at an output of the DCDL on the slope of voltage at the delay elements (e.g., capacitors, varactors, inverters) of the DCDL.

The inventors have recognized that having multiple cascaded stages of delay allows the voltage slope to be steeper and, thus, delay of the inverter to be reduced. The inventors additionally recognized that mismatch between the cascaded stages may be addressed to reap the benefits of the multi-stage cascaded delay design. Three approaches that each address different aspects of the mismatch effects may be used individually or in combinations, according to various embodiments detailed herein. Each of the approaches relates to controlling a state (e.g., first control state is on or activated, second control state is off or deactivated) of the delay elements in the different delay stages of the multi-stage setup. The total number of delay elements that are controlled is based on a value of a control code (e.g., a digital codeword) that ranges from 0 to a full-scale value (e.g., 512, 2023).

A first approach of using complementary switching of delay elements in a first set of delay stages and corresponding delay elements in a second set of delay stages may cancel systematic integral nonlinearity (INL). Specifically, one set is turned on (or activated) while the other set is turned off (or deactivated). Another approach involves cross-stage aggregation to remove stage mismatch and address different strengths of inverters in different delay stages. That is, delay elements in different delay stages are used (i.e., switched on or off) together. The third approach uses segmentation of the delay elements of a delay stage for the most significant bits (MSBs) of the control code to address mismatch among delay elements. Activated delay stages resulting from 1 s for one or more MSBs of the control code are divided among segments of a stage, and the effective number of activated delay stages is a sum of the segments. Segments are turned on (i.e., delay elements are switched on) sequentially and kept on if the code value increases, rather than deactivating delay stages between code implementations.

Beneficially, any one or a combination of the approaches enhances linearity of the DCDL. This, in turn, may reduce the fractional spurs caused by the DCDL. As a result, the ultimate output, in a PLL-based frequency synthesizer using the DCDL, for example, may be improved.

FIG. 1 is a block diagram of aspects of a DCDL 100 according to one or more embodiments. Specifically, FIG. 1 is a block diagram of a feedback DCDL (FBDCDL) with cascaded delay stages 120 according to one or more embodiments. The DCDL 100 obtains clock inputs and provides clock outputs. Specifically, a reference clock input 110*a* and a feedback clock input 110*b* are processed separately to respectively provide a reference clock output 130*a* and a feedback clock output 130*b*. The DCDL 100 may be part of a phase-locked loop (PLL), and the reference clock output 130*a* and the feedback clock output 130*b* may be input to a time-to-digital converter (TDC) 140 that acts as the phase detector of the PLL, for example.

In the exemplary DCDL 100 of FIG. 1, the reference path that provides the reference clock output 130*a* includes four cascaded delay stages 120, connected in series, and the feedback path that provides the reference clock output 130*a* includes four cascaded delay stages 120, connected in series. A code 105 may control the delay stages 120, as further discussed. As detailed with reference to FIGS. 6-8, one or a combination of control schemes may be used to address mismatch between the cascaded delay stages 120 of the feedback and reference paths to enhance linearity of the DCDL 100 and thereby control fractional spurs.

Figures 2, 3:
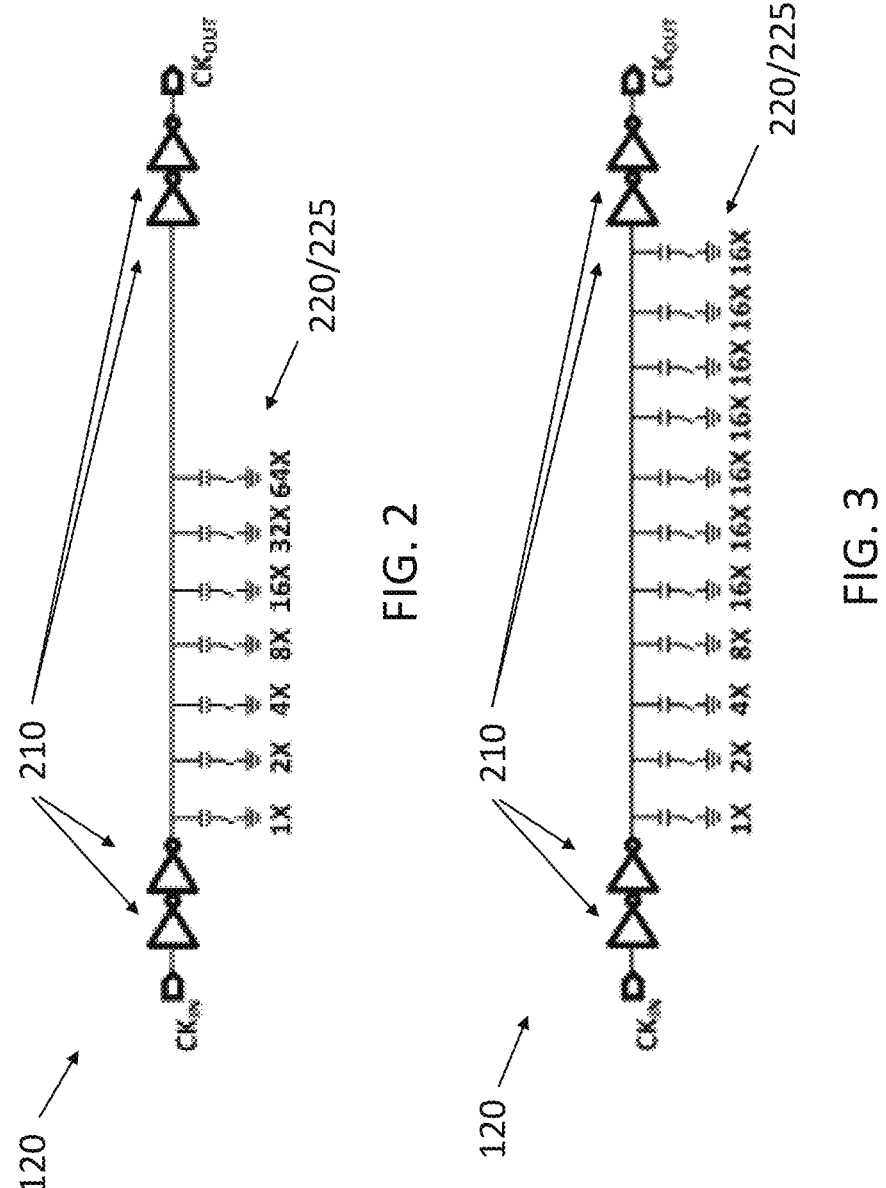
FIG. 2 shows an exemplary delay stage according to one embodiment.
FIG. 3 shows an exemplary delay stage with segmentation according to one embodiment.

FIG. 2 shows an exemplary delay stage 120 according to one embodiment. The delay stage 120 of FIG. 2 includes inverters 210 and a set of capacitors 220 functioning as delay elements 225 in the exemplary case. The labels "1×" through "64×" refer to the number of capacitors 220 in each labeled group and also relate to a codeword value indicated by the code 105 used to activate (i.e., connect) a particular number of capacitors 220. For example, "1×" refers to one capacitor 220 and "2×" refers to two capacitors 220. A code 105 indicating that three capacitors 220 should be activated would result in the capacitor 220 labeled "1×" and the two capacitors 220 indicated by the label "2×" being activated (e.g., connected via one or more switches, for example).

A code 105 indicating that sixty-three capacitors 220 should be activated would result in all the capacitors 220 from "1×" through "32×" being activated. Code 105 indicating that sixty-four capacitors 220 should be activated would then require turning off all of the capacitors 220 from "1×" through "32×" and then activating the capacitors 220 labeled "64×." That is, the active capacitors 220 would go from [1×, 2×, 4×, 8×, 16×, 32×] to [64×] such that six groups of capacitors 220 would be deactivated and one would be activated.

FIG. 3 shows an exemplary delay stage 120 with segmentation according to one embodiment. As FIG. 3 indicates, rather than including groupings of thirty-two capacitors labeled "32×" and sixty-four capacitors 220 labeled "64×," those capacitors 220 are segmented into six additional groups of sixteen capacitors 220 labeled "16×." As a result of this segmentation, fewer groupings of capacitors 220 need to be deactivated and activated based on higher values of the code 105 (i.e., most significant bits of the codeword). For example, to go from a value of the code 105 of sixty-three to sixty-four, the active capacitors 220 would go from [1×, 2×, 4×, 8×, 16×, 16×, 16×] to [16×, 16×, 16×, 16×] such that four groups of capacitors 220 would be deactivated and one would be activated.

Figure 5:
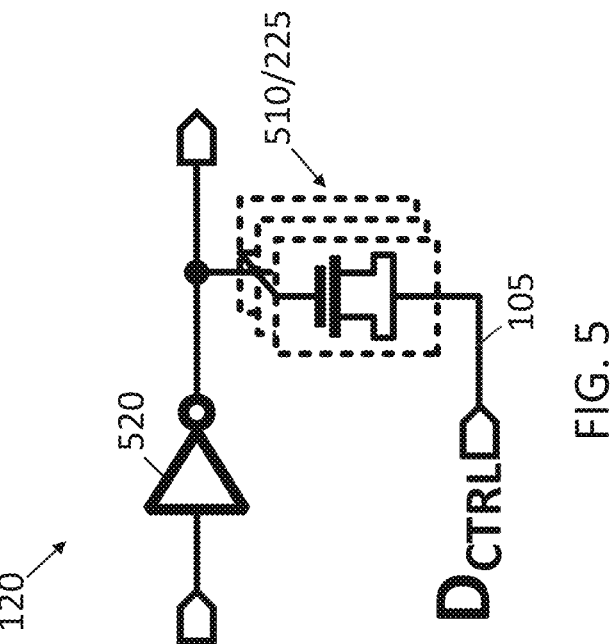
FIG. 5 illustrates an exemplary delay stage with varactors as the delay elements according to one embodiment.
Figure 4:
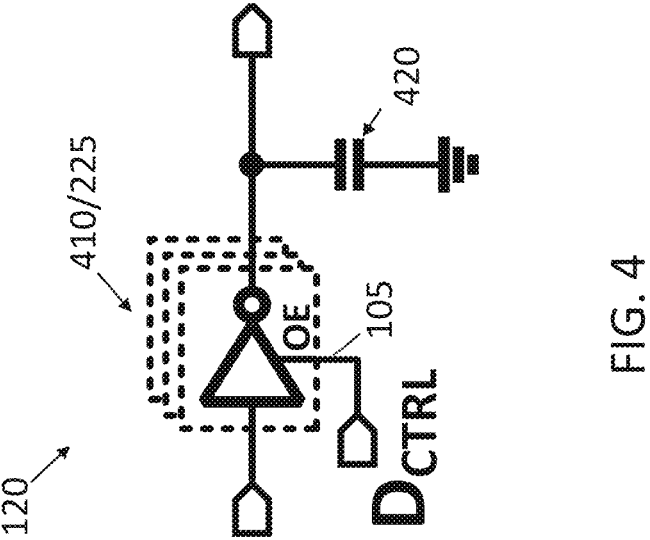
FIG. 4 illustrates an exemplary delay stage with delay elements that are inverters according to one embodiment.

While capacitors are shown as delay elements 225 in FIGS. 2 and 3 for explanatory purposes, it should be understood from the illustrations in FIGS. 4 and 5, for example, that the delay elements 225 are not limited to being capacitors. FIG. 4 illustrates an exemplary delay stage 120 with delay elements 225 that are inverters 410 according to one embodiment. As shown, the delay stage 120 also includes a capacitor 420 and a code 105 provided for activation/deactivation of the inverters 410. FIG. 5 illustrates an exemplary delay stage 120 with varactors 510, which are variable capacitance diodes, as the delay elements 225 according to one embodiment. An inverter 520 and code 105 to control the varactors 510 are also shown.

The exemplary delay stage 120 shown in each of the FIGS. 2-5 is one of four delay stages 120 shown for each of the two paths (reference path and feedback path) in FIG. 1. That is, there are eight delay stages 120 in total in the exemplary configuration of FIG. 1. In FIGS. 2 and 3, for example, one exemplary delay stage 120 is shown with 128 capacitors. Thus, each exemplary delay stage 120 may be controlled with a code 105 from 1 to 128 (where a value of 1 indicates that none of the capacitors 220 are to be activated and a value of 128 indicates that all 128 capacitors 220 are to be activated). In each of the two paths, there are a total of 508 capacitors 220 controlled with 512 values of the code 105.

Figure 6:
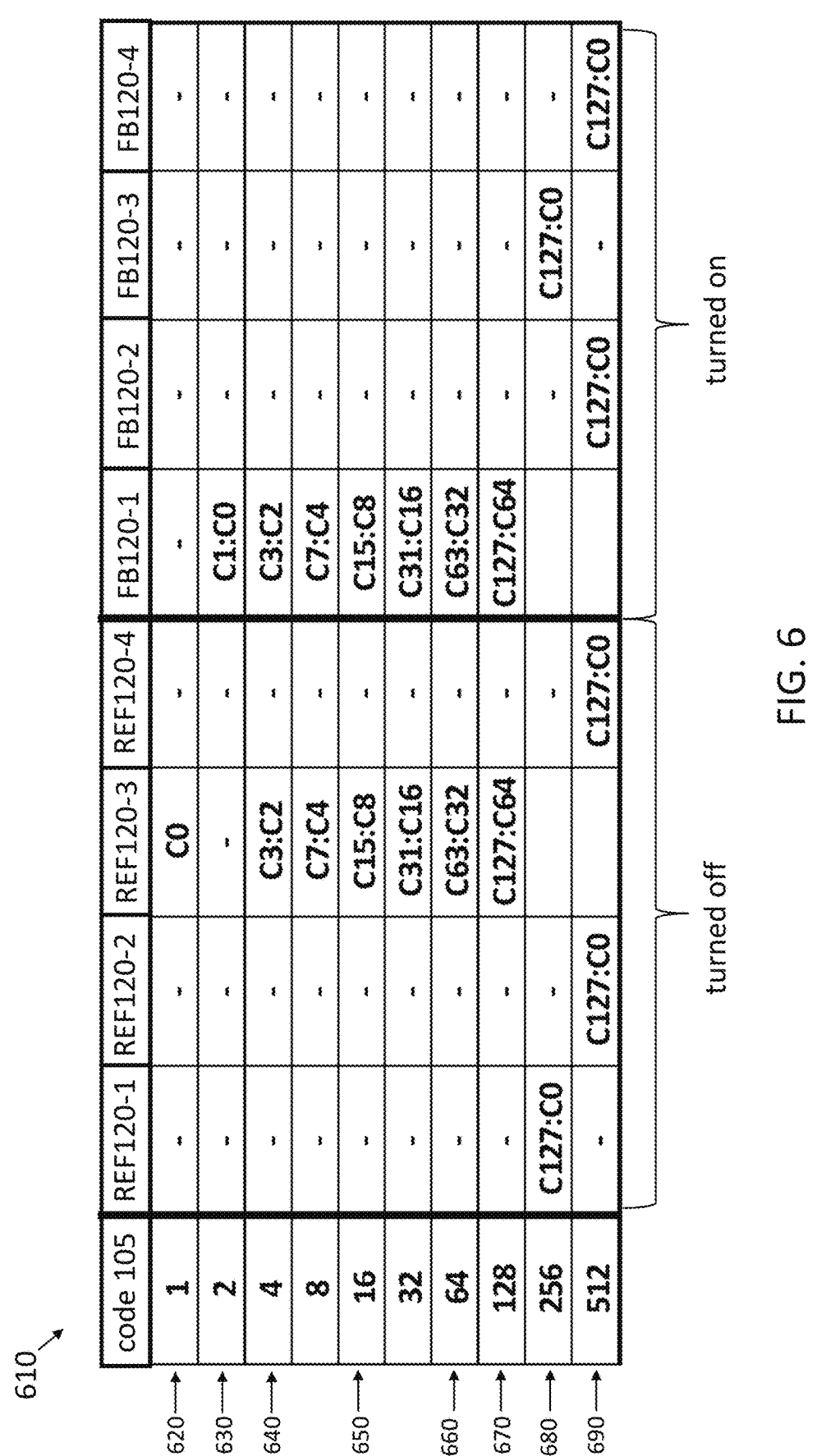
FIG. 6 illustrates a control scheme for complementary activation of the delay elements according to one embodiment.

FIGS. 6-8 illustrate three exemplary control schemes that may be implemented, individually or in different combinations, in order to enhance linearity of the DCDL 100 by addressing mismatch between the cascaded delay stages 120 of the feedback and reference paths. Each of the control schemes is discussed with reference to 128 capacitors 220 as the delay elements 225 for explanatory purposes. However, it should be understood, as previously noted, that the delay elements 225 are not limited to being capacitors 220. Additionally, the number of delay elements 225 per delay stage 120 is not limited to 128.

FIG. 6 illustrates a control scheme for complementary activation of the delay elements 225 according to one embodiment. The table 610 shown in FIG. 6 illustrates complementary control of delay elements 225 in the two (reference and feedback) paths. Specifically, in the exemplary illustration, capacitors 220 denoted in the table 610 that are in a delay stage 120 of the reference path are deactivated or turned off, while capacitors 220 that are in a delay stage 120 of the feedback path are correspondingly activated or turned on. The value of the code 105, which specifies the total number of delay elements 225 that are to be controlled, is shown in the left-most column. Each of the exemplary eight delay stages 120 is denoted as corresponding to one of the additional columns. Specifically, for explanatory purposes, consistent with the arrangement shown in FIGS. 1 and 2, the 128 capacitors 220 (as shown in FIG. 2) in each of the four delay stages of the reference path (shown in FIG. 1) are indicated as REF120-1 through REF120-4 and the 128 capacitors 220 (as shown in FIG. 2) in each of the four delay stages of the feedback path (shown in FIG. 1) are indicated as FB120-1 through FB120-4.

Controlled capacitors 220 are listed as elements in the table 610. As the table 610 indicates at row 620, when the control code 105 specifies that 1 capacitor 220 should be controlled among all the delay stages 120 of both paths, the capacitor 220 denoted as "C0" (e.g., capacitor "1×" according to the arrangement in FIG. 2) in the third delay stage 120 of the reference path (REF120-3) is turned off or deactivated. As indicated at row 630 of the table 610, when the control code 105 specifies that 2 (total) capacitors 220 should be controlled, capacitors 220 denoted as "C1:C0" (e.g., capacitors "2×" according to the arrangement in FIG. 2) in the first delay stage 120 of the feedback path (FB120-1) are activated. These are non-limiting examples, and other delay stages 120 may be selected in alternate embodiments.

The complementary nature of the control scheme is illustrated when 4 or more capacitors 220 are specified for control by the code 105. As the table 610 indicates, each value of the code 105 that is 4 or more results in a same number of capacitors 220 being controlled in the reference path (in which capacitors 220 are turned off) and the feedback path (in which capacitors 220 are turned on). For example, when the code 105 specifies that 4 total capacitors 220 should be controlled (row 640 of the table 610), 2 capacitors 220 in the reference path are turned off and 2 capacitors 220 in the feedback path are turned on. This is indicated by capacitors 220 denoted as "C3:C2" in each of the columns REF120-3 and FB120-1 in row 640. Similarly, when 16 total capacitors 220 are to be controlled according to the code 105, 8 capacitors 220 denoted as "C15:C8" in column REF120-3 (i.e., in the reference path) are indicated as being turned off and 8 capacitors 220, also denoted as "C15:C8" in column FB120-3 (i.e., in the feedback path) are indicated as being turned on in row 650. As another example, when the code 105 specifies that 64 capacitors 220 should be controlled in total, 32 capacitors 220 denoted as "C63:32" in column REF120-3 (i.e., in the reference path) are indicated as being turned off and 32 capacitors 220, also denoted as "C63:C32" in column FB120-3 (i.e., in the feedback path) are indicated as being turned on in row 660.

When the code 105 specifies that 128 capacitors should be controlled, 64 capacitors 220 denoted as "C127:C64" in column REF120-3 are indicated as being turned off, and 64 capacitors 220 in column FB120-1 are indicated as being turned on in row 670. These may be the sixty-four capacitors 220 indicated as "64×" in FIG. 2, for example. When the code 105 specifies that 256 capacitors 220 should be on, all of the 128 capacitors 220 denoted as "C127:C0" in the column REF120-3 (i.e., in the third delay stage 120 of the reference path) are indicated as being turned off and all 128 capacitors 220 in the column FB120-1 (i.e., in the first delay stage 120 of the feedback column) are indicated as being turned on in row 680. Thus, when any more capacitors 220 are specified by the code 105, capacitors 220 in other delay stages 120 must also be used. For example, as shown in row 690, when the code 105 specifies that 512 capacitors 220 should be controlled, all the 128 capacitors 220 in two columns REF120-2 and REF120-4 pertaining to two delay stages 120 in the reference path are turned off, and all the 128 capacitors 220 in the two columns FB120-2 and FB120-4 pertaining to two delay stages 120 in the feedback path are turned on.

FIG. 7 illustrates a control scheme for cross-stage aggregation of delay elements 225 according to one embodiment. In the exemplary illustration of FIG. 7, both cross-stage aggregation, which involves aggregating the number of controlled delay elements 225 across delay stages 120, and complementary activation, which involves activating/deactivating delay elements 225 in complementary delay stages 120 of the reference and feedback paths, are illustrated. Thus, the table 710 shown in FIG. 7 illustrates that delay elements 225 among different delay stages 120 in both the reference and feedback paths are controlled together. The cross-stage aggregation may remove stage mismatch and address the fact that inverters in the different delay stages 120 may have different strengths. As previously noted, the complementary activation may cancel systematic INL. In alternate embodiments, each of the approaches may be used individually. That is, complementary activation alone may be used, as illustrated in FIG. 6, or cross-stage aggregation alone, without the complementary control in the parallel path, may be used.

The organization of the table 710 is the same as the organization of the table 610 and the controlled capacitors 220 are indicated. In addition, as in the example shown in FIG. 6, the controlled capacitors 220 in the reference path are turned off and the controlled capacitors 220 in the feedback path are turned on. Thus, the eight exemplary delay stages 120, four in the reference path (REF120-1 through REF120-4) and four in the feedback path (FB-1 through FB-4) are indicated and 128 capacitors 220 are discussed as the delay elements 225 in each of the eight delay stages 120 for explanatory purposes, according to the non-limiting example in FIG. 2. As table 710 indicates, when the code 105 specifies that 1 capacitor 220 should be controlled, neither cross-stage aggregation nor complementary activation is possible. When 2 capacitors 220 are specified by the code 105, capacitors 220 denoted as "C0" are activated in two delay stages 120 in the feedback path (FB120-1 and FB120-2) according to the cross-stage aggregation approach. When the code 105 specifies 4 capacitors 220 for control, complementary and cross-stage aggregation are illustrated by the deactivation of 2 capacitors denoted as "C0" in two delay stages 120 of the reference path (REF120-1 and REF120-2) and the activation of 2 capacitors 220 denoted as "C0" in two delay stages 120 in the feedback path (FB120-3 and FB120-4).

As table 710 indicates, when the total number of capacitors 220 to be controlled, as specified by the code 105, is an integer multiple of 8, then capacitors 220 in every delay stage 120 are used according to the cross-stage aggregation, and delay stages 120 in both the reference and feedback paths are used according to the complementary activation scheme. For example, when the code 105 specifies that a total of 64 capacitors 220 should be controlled, then 8 capacitors 220 denoted as "C15:C8" are deactivated in each of the four exemplary delay stages 120 in the reference path (for a total of 32 capacitors 220 in the reference path) and 8 capacitors 220 denoted as "C15:C8" are activated in each of the four delay stages 120 in the feedback path (i.e., columns FB120-1 to FB120-4). Similarly, when the code 105 specifies a total of 512 capacitors 220 for activation, then capacitors 220 denoted as "C127:C64" are deactivated in every delay stage 120 in the reference path and are activated in every delay stage 120 in the feedback path.

FIG. 8 illustrates a control scheme using segmentation of the delay elements 225 associated with higher values of the code 105 (e.g., MSBs of the codeword). Delay elements 225 associated with MSBs of the codeword (e.g., higher values of the code 105) are controlled sequentially and kept in the previously controlled state if the code 105 value increases, rather than deactivating delay stages 120 between code implementations. This addresses mismatch of the delay elements 225 associated with the MSBs of the code 105. Segmentation is illustrated in FIG. 3. For example, the thirty-two capacitors 220 denoted as "32×" and the sixty-four capacitors 220 denoted as "64×" in FIG. 2 are segmented into six sets of sixteen capacitors 220 denoted as "16×" in FIG. 3. As a comparison of the first column of tables 610 and 710 with the first column of table 810 indicates, the code values in table 810 are segmented. That is between the values 128 and 256 is another value 192, and between the values 256 and 512 are values of 320, 384, and 448.

In the exemplary illustration of FIG. 8, cross-stage aggregation and complementary activation are combined with the segmentation. Thus, the table 810 shown in FIG. 8 illustrates that delay elements 225 among different delay stages 120 in both the reference and feedback paths are controlled together, as previously discussed with reference to FIGS. 6 and 7. Additionally, as the value of the code 105 increases starting at 128, the controlled state of previously controlled capacitors 220 is maintained.

Techniques operating according to the principles described herein may be implemented in any suitable manner. The processing and decision blocks of the flowcharts above represent steps and acts that may be included in algorithms that carry out these various processes. Algorithms derived from these processes may be implemented as software integrated with and directing the operation of one or more single- or multi-purpose processors, may be implemented as functionally equivalent circuits such as a DSP circuit or an ASIC, or may be implemented in any other suitable manner. It should be appreciated that the flowcharts included herein do not depict the syntax or operation of any particular circuit or of any particular programming language or type of programming language. Rather, the flowcharts illustrate the functional information one skilled in the art may use to fabricate circuits or to implement computer software algorithms to perform the processing of a particular apparatus carrying out the types of techniques described herein. For example, the flowcharts, or portion(s) thereof, may be implemented by hardware alone (e.g., one or more analog or digital circuits, one or more hardware-implemented state machines, etc., and/or any combination(s) thereof) that is configured or structured to carry out the various processes of the flowcharts. In some examples, the flowcharts, or portion(s) thereof, may be implemented by machine-executable instructions (e.g., machine-readable instructions, computer-readable instructions, computer-executable instructions, etc.) that, when executed by one or more single- or multi-purpose processors, carry out the various processes of the flowcharts. It should also be appreciated that, unless otherwise indicated herein, the particular sequence of steps and/or acts described in each flowchart is merely illustrative of the algorithms that may be implemented and can be varied in implementations and embodiments of the principles described herein.

Accordingly, in some embodiments, the techniques described herein may be embodied in machine-executable instructions implemented as software, including as application software, system software, firmware, middleware, embedded code, or any other suitable type of computer code. Such machine-executable instructions may be generated, written, etc., using any of a number of suitable programming languages and/or programming or scripting tools, and also may be compiled as executable machine language code or intermediate code that is executed on a framework, virtual machine, or container.

When techniques described herein are embodied as machine-executable instructions, these machine-executable instructions may be implemented in any suitable manner, including as a number of functional facilities, each providing one or more operations to complete execution of algorithms operating according to these techniques. A "functional facility." however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way.

Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc., that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application.

Some exemplary functional facilities have been described herein for carrying out one or more tasks. It should be appreciated, though, that the functional facilities and division of tasks described is merely illustrative of the type of functional facilities that may implement using the exemplary techniques described herein, and that embodiments are not limited to being implemented in any specific number, division, or type of functional facilities. In some implementations, all functionalities may be implemented in a single functional facility. It should also be appreciated that, in some implementations, some of the functional facilities described herein may be implemented together with or separately from others (e.g., as a single unit or separate units), or some of these functional facilities may not be implemented.

Machine-executable instructions implementing the techniques described herein (when implemented as one or more functional facilities or in any other manner) may, in some embodiments, be encoded on one or more computer-readable media, machine-readable media, etc., to provide functionality to the media. Computer-readable media include magnetic media such as a hard disk drive, optical media such as a CD or a DVD, a persistent or non-persistent solid-state memory (e.g., Flash memory, Magnetic RAM, etc.), or any other suitable storage media. Such a computer-readable medium may be implemented in any suitable manner. As used herein, the terms "computer-readable media" (also called "computer-readable storage media") and "machine-readable media" (also called "machine-readable storage media") refer to tangible storage media. Tangible storage media are non-transitory and have at least one physical, structural component. In a "computer-readable medium" and "machine-readable medium" as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium, a machine-readable medium, etc., may be altered during a recording process.

Further, some techniques described above comprise acts of storing information (e.g., data and/or instructions) in certain ways for use by these techniques. In some implementations of these techniques—such as implementations where the techniques are implemented as machine-executable instructions—the information may be encoded on a computer-readable storage media. Where specific structures are described herein as advantageous formats in which to store this information, these structures may be used to impart a physical organization of the information when encoded on the storage medium. These advantageous structures may then provide functionality to the storage medium by affecting operations of one or more processors interacting with the information; for example, by increasing the efficiency of computer operations performed by the processor(s).

In some, but not all, implementations in which the techniques may be embodied as machine-executable instructions, these instructions may be executed on one or more suitable computing device(s) and/or electronic device(s) operating in any suitable computer and/or electronic system, or one or more computing devices (or one or more processors of one or more computing devices) and/or one or more electronic devices (or one or more processors of one or more electronic devices) may be programmed to execute the machine-executable instructions. A computing device, electronic device, or processor (e.g., processor circuitry) may be programmed to execute instructions when the instructions are stored in a manner accessible to the computing device, electronic device, or processor, such as in a data store (e.g., an on-chip cache or instruction register, a computer-readable storage medium and/or a machine-readable storage medium accessible via a bus, a computer-readable storage medium and/or a machine-readable storage medium accessible via one or more networks and accessible by the device/processor, etc.). Functional facilities comprising these machine-executable instructions may be integrated with and direct the operation of a single multi-purpose programmable digital computing device, a coordinated system of two or more multi-purpose computing device sharing processing power and jointly carrying out the techniques described herein, a single computing device or coordinated system of computing device (co-located or geographically distributed) dedicated to executing the techniques described herein, one or more FPGAs for carrying out the techniques described herein, or any other suitable system.

Embodiments have been described where the techniques are implemented in circuitry and/or machine-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The phrase "and/or," as used herein in the specification and in the claims, should be understood to mean "either or both," of the elements so conjoined, e.g., elements that are conjunctively present in some cases and disjunctively present in other cases. Multiple elements listed with "and/or" should be construed in the same fashion, e.g., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

The indefinite articles "a" and "an," as used herein in the specification and in the claims, unless clearly indicated to the contrary, should be understood to mean "at least one."

As used herein in the specification and in the claims, the phrase, "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently, "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

All definitions, as defined and used herein, should be understood to control over dictionary definitions, definitions in documents incorporated by reference, and/or ordinary meanings of the defined terms.

The word "exemplary" is used herein to mean serving as an example, instance, or illustration. Any embodiment, implementation, process, feature, etc., described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the spirit and scope of the principles described herein. Accordingly, the foregoing description and drawings are by way of example only.

What is claimed is:

1. A digitally controlled delay device, the device comprising:

a plurality of first delay stages connected in series between a first input port and a first output port;

a plurality of second delay stages connected in series between a second input port and a second output port, wherein each first delay stage of the plurality of first delay stages includes a plurality of first delay elements and each second delay stage of the plurality of second delay stages includes a corresponding plurality of second delay elements; and a controller configured to perform complementary control of the plurality of first delay elements in one of the plurality of first delay stages and the plurality of second delay elements in one of the plurality of second delay stages based on a digital control signal, wherein the digital control signal is not an input signal of each of the plurality of first delay stages and the plurality of second delay stages, the complementary control refers to controlling one or more of the plurality of first delay elements specified by the digital control signal to be in a first control state and controlling a corresponding one or more of the plurality of second delay elements to be in a second control state, opposite the first control state, and the first control state is an activation of the one or more of the plurality of first delay elements, and the second control state is a deactivation of the corresponding one or more of the plurality of second delay elements;

wherein the controller is further configured to perform complementary control for the plurality of first delay stages and the plurality of second delay stages such that, when the one or more of the plurality of first delay elements of the plurality of first delay stages are controlled to be in the first control state, corresponding one or more of the plurality of second delay elements of the plurality of second delay stages are controlled to be in the second control state.

2. The device according to claim 1, wherein the controller is further configured to maintain the first control state for the one or more of the plurality of first delay elements of the plurality of first delay stages when controlling additional ones of the plurality of the first delay elements of the plurality of first delay stages to be in the first control state.

3. The device according to claim 1, wherein the first control state is on and the second control state is off.

4. The device according to claim 1, wherein the plurality of first delay elements and the plurality of second delay elements are capacitors, inverters, or varactors.

5. A digitally controlled delay device, the device comprising:

a plurality of first delay stages connected in series between a first input port and a first output port;

a plurality of second delay stages connected in series between a second input port and a second output port, wherein each first delay stage of the plurality of first delay stages includes a plurality of first delay elements and each second delay stage of the plurality of second delay stages includes a corresponding plurality of second delay elements; and a controller configured to perform complementary control of the plurality of first delay elements in one of the plurality of first delay stages and the plurality of second delay elements in one of the plurality of second delay stages based on a digital control signal, wherein the digital control signal is not an input signal of each of the plurality of first delay stages and the plurality of second delay stages, the complementary control refers to controlling one or more of the plurality of first delay elements specified by the digital control signal to be in a first control state and controlling a corresponding one or more of the plurality of second delay elements to be in a second control state, opposite the first control state, and the first control state is an activation of the one or more of the plurality of first delay elements, and the second control state is a deactivation of the corresponding one or more of the plurality of second delay elements;

wherein the device is used in a phase locked loop (PLL).

6. The device according to claim 5, wherein the plurality of first delay stages are in a reference path of the PLL.

7. The device according to claim 6, wherein the plurality of second delay stages are in a feedback path of the PLL.

8. A digitally controlled delay device comprising:
a plurality of first delay stages connected in series between a first input port and a first output port;
a plurality of second delay stages connected in series between a second input port and a second output port, wherein each first delay stage of the plurality of first delay stages includes a plurality of first delay elements and each second delay stage of the plurality of second delay stages includes a corresponding plurality of second delay elements; and
a controller configured to perform complementary control of the plurality of first delay elements in each of the plurality of first delay stages and the plurality of second delay elements in each of the plurality of second delay stages based on a digital control signal, wherein the digital control signal is not an input signal of each of the plurality of first delay stages and the plurality of second delay stages, the complementary control refers to controlling one or more of the plurality of first delay elements specified by the digital control signal to be in a first control state and controlling a corresponding one or more of the plurality of second delay elements to be in a second control state, opposite the first control state, and the first control state is an activation of the one or more of the plurality of first delay elements, and the second control state is a deactivation of the corresponding one or more of the plurality of second delay elements;

wherein the device is used in a phase locked loop (PLL).

9. The device according to claim 8, wherein the plurality of first delay stages are in a reference path of the PLL.

10. The device according to claim 9, wherein the plurality of second delay stages are in a feedback path of the PLL.

11. The device according to claim 8, wherein the first control state is on and the second control state is off.

12. The device according to claim 8, wherein the plurality of first delay elements and the plurality of second delay elements are capacitors, inverters, or varactors.

13. A digitally controlled delay device comprising:
a plurality of first delay stages connected in series between a first input port and a first output port;
a plurality of second delay stages connected in series between a second input port and a second output port, wherein each first delay stage of the plurality of first delay stages includes a plurality of first delay elements and each second delay stage of the plurality of second delay stages includes a corresponding plurality of second delay elements; and
a controller configured to control, based on a code indicated by a digital control signal, the plurality of first delay elements in the plurality of first delay stages and the plurality of second delay elements in the plurality of second delay stages, wherein
based on a first code, the controller controls a first set of the plurality of first delay elements of one of the plurality of first delay stages or the plurality of second delay elements of one of the plurality of second delay stages to be in a first state, the first code specifying a number of the first set, and
based on a second code, greater than the first code, the controller maintains the first set of the plurality of first delay elements of one of the plurality of first delay stages or the plurality of second delay elements of one of the plurality of second delay stages in the first state and controls additional ones of the plurality of first delay elements of one of the plurality of first delay stages or the plurality of second delay elements of one of the plurality of second delay stages to be in a first state, a number of the additional ones being a difference between a number specified by the second code and the number of the first set.

14. The device according to claim 13, wherein the device is used in a phase locked loop (PLL).

15. The device according to claim 14, wherein the plurality of first delay stages are in a reference path of the PLL.

16. The device according to claim 15, wherein the plurality of second delay stages are in a feedback path of the PLL.

17. The device according to claim 13, wherein the first control state is on and the second control state is off.

18. The device according to claim 13, wherein the plurality of first delay elements and the plurality of second delay elements are capacitors, inverters, or varactors.

* * * * *